US011469750B2

(12) United States Patent
Sato

(10) Patent No.: US 11,469,750 B2
(45) Date of Patent: Oct. 11, 2022

(54) SWITCHING APPARATUS AND DETERMINATION APPARATUS

(71) Applicant: FUJI ELECTRIC CO., LTD., Kanagawa (JP)

(72) Inventor: Tadahiko Sato, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/385,970

(22) Filed: Jul. 27, 2021

(65) Prior Publication Data
US 2022/0052680 A1 Feb. 17, 2022

(30) Foreign Application Priority Data

Aug. 11, 2020 (JP) .............................. JP2020-135899

(51) Int. Cl.
*H02M 1/32* (2007.01)
*H03K 17/0812* (2006.01)
*H02M 1/00* (2006.01)

(52) U.S. Cl.
CPC ...... *H03K 17/0812* (2013.01); *H02M 1/0009* (2021.05); *H02M 1/32* (2013.01)

(58) Field of Classification Search
CPC ... H02M 1/0009; H02M 1/32; H03K 17/0812

USPC .................................................. 327/108, 109
See application file for complete search history.

(56) References Cited

U.S. PATENT DOCUMENTS

| | | | |
|---|---|---|---|
| 9,537,303 B2 * | 1/2017 | Tanaka | H02H 9/025 |
| 10,778,001 B2 | 9/2020 | Uchida | |
| 2016/0308524 A1 * | 10/2016 | Inoue | H03K 17/168 |
| 2019/0238123 A1 * | 8/2019 | Yamanaka | H02H 7/20 |
| 2021/0028614 A1 * | 1/2021 | Sugiyama | H03K 21/02 |
| 2021/0141408 A1 * | 5/2021 | Yasusaka | G05F 1/56 |

FOREIGN PATENT DOCUMENTS

| | | |
|---|---|---|
| JP | H0696894 A | 4/1994 |
| WO | 2018193527 A1 | 10/2018 |

* cited by examiner

*Primary Examiner* — William Hernandez

(57) ABSTRACT

Provided is a switching apparatus and a determination apparatus connected to the switching apparatus. The switching apparatus comprises: a first switching device and a second switching device, wherein each first main terminal is connected to a first reference potential; an opposing switching device, wherein a second main terminal is connected to a second reference potential; an output wiring section; a first detector for detecting a first detection value changing in accordance with current flowing in the first switching device; and a second detector for detecting a second detection value changing in accordance with current flowing in the second switching device.

13 Claims, 8 Drawing Sheets

SWITCHING APPARATUS AND DETERMINATION APPARATUS

The contents of the following Japanese patent application(s) are incorporated herein by reference:
  NO. 2020-135899 filed in JP on Aug. 11, 2020.

BACKGROUND

1. Technical Field

The present invention relates to a switching apparatus and a determination apparatus.

2. Related Art

Patent document 1 discloses "when a terminal voltage V'cea measured in a driving circuit 3 is input into a comparator circuit 11, and the measured value is larger compared with a preset reference value, a signal for stopping an operation of an IGBT 2a is output. An arm short circuit is also detected in a similar way for IGBTs 2b to 2d. A load short circuit detects a direct current by a sensor 10 provided in series on an output side of an inverter circuit 4. While an output current Iinv of the inverter circuit 4 at normal times is a sinusoidal alternating current as shown in FIG. 4, an output current I'inv in a case of load short circuit is larger than the current at normal times. When the detected output current is input to a comparator circuit 12 and compared with a preset reference value, if the detected value is higher, a signal for stopping the operation of IGBT 2 is output" (paragraphs 0015-0016).

Patent document 2 discloses "in the overcurrent detecting circuit and the electrical power converting device according to embodiment 2, when di/dt exceeds a first threshold, it is determined that an arm short circuit, which is a first short circuit has occurred in a switching device, and when di/dt exceeds a second threshold which is lower than a first threshold, it is determined that a load short circuit which is a second short circuit has occurred in a switching device" (paragraph 0038).

PRIOR ART DOCUMENTS

Patent Documents

Patent Document 1: Japanese Patent Application Publication No. H6-96894
Patent Document 2: WO 2018/0193527

According to Patent Document 1, because an arm short circuit is detected by driving circuit 3, and a load short circuit is detected by sensor 10, two types of detecting means are required for distinguishing these short circuits. According to Patent Document 2, because an arm short circuit and a load short circuit are distinguished by a magnitude of di/dt but the magnitude of di/dt depends on the state of a load or the like, it is difficult to always obtain a correct distinguishing result.

SUMMARY

A first aspect of the present invention provides a switching apparatus. The switching apparatus may comprise a first switching device and a second switching device, wherein each of them includes a first main terminal and a second main terminal, and each first main terminal is connected to a first reference potential. The switching apparatus may comprise an opposing switching device including a first main terminal and a second main terminal, wherein the second main terminal is connected to a second reference potential. The switching apparatus may comprise an output wiring section for connecting the second main terminal of the first switching device, the second main terminal of the second switching device, the first main terminal of the opposing switching device and an output terminal, wherein a wire resistance between the second main terminal of the first switching device and the output terminal is lower than a wire resistance between the second main terminal of the second switching device and the output terminal, and a wire resistance between the second main terminal of the first switching device and the first main terminal of the opposing switching device is higher than a wire resistance between the second main terminal of the second switching device and the first main terminal of the opposing switching device. The switching apparatus may comprise a first detector for detecting a first detection value changing in accordance with current flowing in the first switching device. The switching apparatus may comprise a second detector for detecting a second detection value changing in accordance with current flowing in the second switching device.

The switching apparatus may further comprise a determining unit for determining whether an overcurrent flows in the output terminal or in the opposing switching device by using the first detection value and the second detection value.

The determining unit may determine that an overcurrent flows in the output terminal according to that current flowing in the first switching device is larger than current flowing in the second switching device, and an overcurrent flows in the first switching device. The determining unit may determine that an overcurrent flows in the opposing switching device according to that the current flowing in the second switching device is larger than the current flowing in the first switching device, and an overcurrent flows in the second switching device.

The first detector may include a current sensor for detecting the first detection value corresponding to current flowing in the first switching device or a temperature sensor for detecting the first detection value corresponding to a temperature of the first switching device. The second detector may include a current sensor for detecting the second detection value corresponding to current flowing in the second switching device or a temperature sensor for detecting the second detection value corresponding to a temperature of the second switching device.

The output wiring section may include a first wiring which has a first end and a second end and to which the second main terminal of the first switching device is connected at a point closer to the first end than the second main terminal of the second switching device. The output terminal may be connected to the first end side of the first wiring, and the first main terminal of the opposing switching device may be connected to the second end side of the first wiring.

The output wiring section may include a second wiring which has a first end and a second end and to which the first main terminal of a first opposing switching device is connected at a point closer to the first end than the first main terminal of a second opposing switching device. The output wiring section may further include a third wiring for connecting the second end side of the first wiring and the second end side of the second wiring.

The first wiring and the second wiring may extend in parallel in a manner that the first end of the first wiring and the first end of the second wiring as well as the second end of the first wiring and the second end of the second wiring respectively oppose each other.

A second aspect of the present invention provides a determination apparatus. The determination apparatus may be connected to a switching apparatus. The switching apparatus may comprise a first switching device and a second switching device, wherein each of them includes a first main terminal and a second main terminal, and each first main terminal is connected to a first reference potential. The switching apparatus may comprise an opposing switching device including a first main terminal and a second main terminal, wherein the second main terminal is connected to a second reference potential. The switching apparatus may comprise an output wiring section for connecting the second main terminal of the first switching device, the second main terminal of the second switching device, the first main terminal of the opposing switching device and an output terminal, wherein a wire resistance between the second main terminal of the first switching device and the output terminal is lower than a wire resistance between the second main terminal of the second switching device and the output terminal, and a wire resistance between the second main terminal of the first switching device and the first main terminal of the opposing switching device is higher than a wire resistance between the second main terminal of the second switching device and the first main terminal of the opposing switching device. The switching apparatus may comprise a first detector for detecting a first detection value changing in accordance with current flowing in the first switching device. The switching apparatus may comprise a second detector for detecting a second detection value changing in accordance with current flowing in the second switching device. The determination apparatus may comprise a determining unit for determining whether an overcurrent flows in the output terminal or in the opposing switching device by using the first detection value and the second detection value.

Note that, the summary clause does not necessarily describe all necessary features of the embodiments of the present invention. The invention may also be a sub-combination of the features described above.

DESCRIPTION OF EXEMPLARY EMBODIMENTS

Hereinafter, the present invention will be described by way of embodiments, but the following embodiments are not intended to limit the invention specified in the claims. Also, all combinations of features described in the embodiments are not necessarily essential to solutions of the invention.

Figure 1:
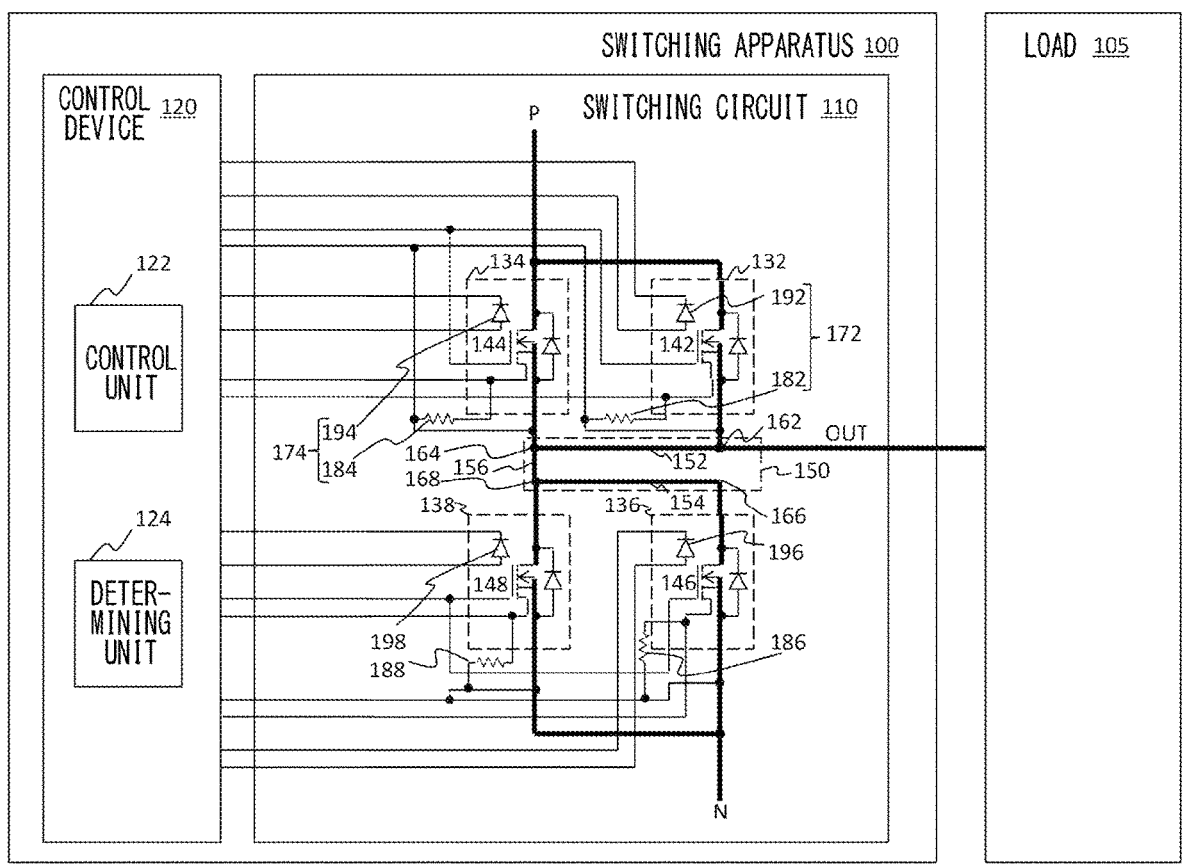
FIG. 1 shows a configuration of a switching apparatus according to the present embodiment with a load.

FIG. 1 shows a configuration of a switching apparatus 100 according to the present embodiment with a load 105. The switching apparatus 100 according to the present embodiment is configured to be able to detect whether an overcurrent flows in a switch on a lower arm (an opposing arm) side or in the load 105, in accordance with a result obtained by detecting currents flowing in two switches on a to-be-detected upper arm side.

Herein, the load 105 is a circuit or a device which consumes electrical power supplied by the switching apparatus 100. The load 105 may be a device such as an electric apparatus, a motor and a power converter, which uses a voltage output by the switching apparatus 100.

The switching apparatus 100 comprises a switching circuit 110 and a control device 120. The switching circuit 110 comprises a first switch 132, a second switch 134, a first opposing switch 136, a second opposing switch 138, a first current detecting resistor 182, a second current detecting resistor 184, a third current detecting resistor 186, a fourth current detecting resistor 188, and an output wiring section 150. The switching circuit 110 may be implemented as a power semiconductor module.

The first switch 132 and the second switch 134 are switches on the upper arm side in the switching circuit 110. The first switch 132 and the second switch 134 are connected in parallel such that main terminals of each switch are provided between a reference potential P and an output terminal OUT. In the present embodiment, the reference potential P is an example of a first reference potential.

The first switch 132 includes a first switching device 142 and a first thermal diode 192. The first switching device 142 includes a positive-side main terminal, a negative-side main terminal and a control terminal. In the present embodiment, the positive-side main terminal is an example of a first main terminal, and the negative-side main terminal is an example of a second main terminal. The positive-side main terminal of the first switching device 142 is connected to the reference potential P, which is the reference potential on a positive side of the switching circuit 110. The negative-side main terminal of the first switching device 142 is connected to the output terminal OUT via the output wiring section 150. The control terminal of the first switching device 142 is connected to the control device 120. Also, the first switching device 142 according to the present embodiment includes a sense terminal for detecting current flowing between main terminals.

In the present embodiment, the first switching device 142 is a metal-oxide-semiconductor field-effect transistor (MOSFET). The positive-side main terminal of the first switching device 142 is a drain, the negative-side main terminal is a source, and the control terminal is a gate. In another embodiment, the first switching device 142 may be another transistor such as an insulated gate bipolar transistor (IGBT).

The first switching device 142 may be connected in anti-parallel between main terminals and may include a diode for refluxing, to the reference potential P side, current flowing from the output terminal OUT while each switching device in the switching circuit 110 is off. This diode may be a diode added to a body of the first switching device 142, and may be a parasitic diode of the first switching device 142.

The first thermal diode 192 is arranged in the vicinity of the first switching device 142, and functions as a temperature sensor for detecting a temperature of the first switching device 142. Herein, when current flowing in the first switching device 142 becomes larger, a temperature of the first switching device 142 becomes higher, and when current flowing in the first switching device 142 becomes smaller, a temperature of the first switching device 142 becomes lower. Thus, the first thermal diode 192 can output a temperature detection value of the first switching device 142 as a detection value changing in accordance with the current flowing in the first switching device 142. The first switch 132 may include, instead of the first thermal diode 192, another temperature sensor element using a PNP transistor, a NPN transistor or the like.

The second switch 134 includes a second switching device 144 and a second thermal diode 194. Functions and a configuration of the second switching device 144 and the second thermal diode 194 are similar to those of the first switching device 142 and the first thermal diode 192 in the first switch 132, and thus the descriptions thereof are omitted.

The first opposing switch 136 and the second opposing switch 138 are the switches on the lower arm side in the switching circuit 110. The first opposing switch 136 and the second opposing switch 138 are connected in parallel such that main terminals of each switch are provided between the output terminal OUT and a reference potential N. In the present embodiment, the reference potential N is an example of a second reference potential.

The first opposing switch 136 includes a first opposing switching device 146 and a third thermal diode 196. Functions and a configuration of the first opposing switching device 146 and the third thermal diode 196 are similar to those of the first switching device 142 and the first thermal diode 192 in the first switch 132, and thus the descriptions thereof are omitted except for differences hereinafter.

The first opposing switching device 146 includes a positive-side main terminal, a negative-side main terminal and a control terminal. The negative-side main terminal of the first opposing switching device 146 is connected to the reference potential N, which is the reference potential on a negative side of the switching circuit 110. The positive-side main terminal of the first opposing switching device 146 is connected to the output terminal OUT via the output wiring section 150. The control terminal of the first opposing switching device 146 is connected to the control device 120. Also, the first opposing switching device 146 according to the present embodiment includes a sense terminal for detecting current flowing between main terminals.

The first opposing switching device 146 may be connected in anti-parallel between main terminals and include a diode for flowing current draining from the reference potential N side into the output terminal OUT while each switching device in the switching circuit 110 is off. The diode may be a diode added to a body of the first opposing switching device 146, and may be a parasitic diode of the first opposing switching device 146.

The second opposing switch 138 includes a second opposing switching device 148 and a fourth thermal diode 198. Functions and a configuration of the second opposing switching device 148 and the fourth thermal diode 198 in the second opposing switch 138 are similar to those of the first opposing switching device 146 and the third thermal diode 196 in the first opposing switch 136, and thus the descriptions thereof are omitted.

The first current detecting resistor 182 is connected between the sense terminal and the negative-side main terminal of the first switching device 142. The first current detecting resistor 182 receives a sense current, which is output from the sense terminal of the first switching device 142 and is proportional to the current flowing in the first switching device 142, to generate a sense voltage, which is equal to the result of multiplying the sense current by a resistance value of the first current detecting resistor 182. In this manner, the first current detecting resistor 182 functions as a current sensor for detecting the current of the first switching device 142.

The second current detecting resistor 184, the third current detecting resistor 186 and the fourth current detecting resistor 188 are respectively connected between a sense terminal and a negative-side main terminal of the second switching device 144, between a sense terminal and a negative-side main terminal of the first opposing switching device 146, and between a sense terminal and a negative-side main terminal of the second opposing switching device 148. In a similar way to the first current detecting resistor 182, the second current detecting resistor 184, the third current detecting resistor 186 and the fourth current detecting resistor 188 respectively function as a current sensor for detecting the current of the second switching device 144, a current sensor for detecting the current of the first opposing switching device 146, and a current sensor for detecting the current of the second opposing switching device 148.

The output wiring section 150 connects the negative-side main terminal of the first switching device 142, the negative-side main terminal of the second switching device 144, the positive-side main terminal of the first opposing switching device 146, the positive-side main terminal of the second opposing switching device 148 and the output terminal OUT. The output wiring section 150 has a first wiring 152, a second wiring 154 and a third wiring 156.

The first wiring 152 is a wiring on an upper arm side of the output wiring section 150 and connects the negative-side main terminal of the first switching device 142, the negative-side main terminal of the second switching device 144 and the output terminal OUT. The first wiring 152 includes a first end 162 and a second end 164. The negative-side main terminal of the first switching device 142 is connected to the first wiring 152 at a point closer to the first end 162 than the negative-side main terminal of the second switching device 144. In the present embodiment, the negative-side main terminal of the first switching device 142 is connected to the first end 162, and the negative-side main terminal of the second switching device 144 is connected to the second end 164. The output terminal OUT is connected to the first end 162 side of the first wiring 152. The first opposing switching device 146 and the second opposing switching device 148 are connected to second end 164 side of the first wiring 152.

The second wiring 154 is an wiring of a lower arm side of the output wiring section 150, and connects the positive-side main terminal of the first opposing switching device 146 and the positive-side main terminal of the second opposing switching device 148. The second wiring 154 includes a first end 166 and a second end 168. The positive-side main terminal of the first opposing switching device 146 is connected to the second wiring 154 at a point closer to the first end 166 than the positive-side main terminal of the second opposing switching device 148.

The third wiring 156 is a wiring for connecting the upper arm side and the lower arm side and connects the second end 164 side of the first wiring 152 and the second end 168 side of the second wiring 154.

In the present embodiment, while the negative-side main terminal of the first switching device 142 and the output terminal OUT are connected without interposing the first wiring 152, the first wiring 152 is provided between the negative-side main terminal of the second switching device 144 and the output terminal OUT. Thus, a wiring between the negative-side main terminal of the first switching device 142 and the output terminal OUT is shorter than a wiring between the negative-side main terminal of the second switching device 144 and the output terminal OUT. Thereby, in the present embodiment, a wire resistance between the negative-side main terminal of the first switching device 142 and the output terminal OUT is lower than a wire resistance between the negative-side main terminal of the second switching device 144 and the output terminal OUT. In this manner, a wire resistance from the reference potential P to the first end 162 of the first wiring 152 via the second switching device 144 can be set higher than that via the first switching device 142.

Also, in the present embodiment, while the first wiring 152 is provided between the negative-side main terminal of the first switching device 142 and the positive-side main terminal of the first opposing switching device 146 etc., the first wiring 152 is not provided between the negative-side main terminal of the second switching device 144 and the positive-side main terminal of the first opposing switching device 146 etc. Thus, a wiring between the negative-side main terminal of the first switching device 142 and the positive-side main terminal of the first opposing switching device 146 etc. is longer than a wiring between the negative-side main terminal of the second switching device 144 and the positive-side main terminal of the first opposing switching device 146 etc. Thereby, in the present embodiment, a wire resistance between the negative-side main terminal of the first switching device 142 and the positive-side main terminal of the first opposing switching device 146 etc. is higher than a wire resistance of between the negative-side main terminal of the second switching device 144 and the positive-side main terminal of the first opposing switching device 146 etc. In this manner, a wire resistance from the reference potential P to the second end 168 of the second wiring 154 via the second switching device 144 can be set lower than that via the first switching device 142.

Note that, the above-mentioned output wiring section 150 has different wiring lengths between terminals, which enables a wire resistance between terminals with a longer wiring length to be higher than a wire resistance between terminals with a shorter wiring length. Alternatively, the output wiring section 150 may have wirings between terminals with different widths, which enables a wire resistance between terminals with a wider wiring width to be lower than a wire resistance between terminals with a narrower wiring width. Also, the output wiring section 150 may have wirings between terminals with a different cross-sectional area, which enables a wire resistance between terminals with a wiring having a larger cross-sectional area to be smaller than a wire resistance between terminals with a wiring having a smaller cross-sectional area. Also, the output wiring section 150 may have different materials between terminals, to change the wire resistance between terminals.

The control device 120 is connected to the control terminals of the first switching device 142, the second switching device 144, the first opposing switching device 146 and the second opposing switching device 148 of the switching circuit 110, the first current detecting resistor 182, the second current detecting resistor 184, the third current detecting resistor 186, the fourth current detecting resistor 188, the first thermal diode 192, the second thermal diode 194, the third thermal diode 196, and the fourth thermal diode 198. The control device 120 includes a control unit 122 and a determining unit 124.

The control unit 122 is connected to the control terminals of the first switching device 142, the second switching device 144, the first opposing switching device 146 and the second opposing switching device 148. The control unit 122, in accordance with a command input from outside to the switching apparatus 100, supplies a control signal to the control terminals of the first switching device 142, the second switching device 144, the first opposing switching device 146 and the second opposing switching device 148, to perform a switching control for enabling a voltage of the output terminal OUT in the switching apparatus 100 to be a target voltage. Also, the control unit 122, in accordance with that the determining unit 124 determines that an overcurrent flows in the switching circuit 110, supplies a control signal for turning off the first switching device 142, the second switching device 144, the first opposing switching device 146 and the second opposing switching device 148, to these switching devices, so as to block the overcurrent.

The determining unit 124 is connected to at least one of the first current detecting resistor 182 and the first thermal diode 192, and at least one of the second current detecting resistor 184 and the second thermal diode 194. The determining unit 124 uses at least one of the first current detecting resistor 182 and the first thermal diode 192 as a first detector 172, to obtain a first detection value corresponding to the current flowing in the first switching device 142. The determining unit 124 uses at least one of the second current detecting resistor 184 and the second thermal diode 194 as a second detector 174, to obtain a second detection value corresponding to the current flowing in the second switching device 144.

The determining unit 124 uses the first detection value and the second detection value, to determine whether an overcurrent flows in the output terminal OUT or in the opposing arm including the first opposing switching device 146 and the second opposing switching device 148. Herein, a case where an overcurrent flows from the output terminal OUT to the load 105 due to a failure or the like of the load 105 is referred to as "load short circuit," and a case where an overcurrent flows in an opposing arm due to a failure or the like of the opposing arm is referred to as an "arm short circuit".

When the load short circuit occurs, although the first switching device 142, the second switching device 144, the first opposing switching device 146 and the second opposing switching device 148 operate normally, an overcurrent flows from the output terminal OUT to the load 105. Herein, because the wire resistance between the negative-side main terminal of the first switching device 142 and the output terminal OUT is lower than a wire resistance between the negative-side main terminal of the second switching device 144 and the output terminal OUT, when the load short circuit occurs, current flowing between the negative-side main terminal of the first switching device 142 and the output terminal OUT is larger than current flowing between the negative-side main terminal of the second switching device 144 and the output terminal OUT. As a result, the first detection value by the first detector 172 is larger than the second detection value by the second detector 174. Accordingly, when an overcurrent flows, if the first detection value is higher than the second detection value, the determining unit 124 can determine that an overcurrent flows in the output terminal OUT.

When a short circuit (the arm short circuit) occurs in at least one of the first opposing switching device 146 and the second opposing switching device 148 of the opposing arm (the lower arm in the example of this figure) the first switching device 142 and the second switching device 144 of the upper arm and the first opposing switching device 146 and the second opposing switching device 148 of the lower arm turn on at the same time, and an overcurrent flows from the output wiring section 150 to the opposing arm. Herein, because the wire resistance between the negative-side main terminal of the first switching device 142 and the positive-side main terminal of the first opposing switching device 146 etc. is higher than the wire resistance of between the negative-side main terminal of the second switching device 144 and the positive-side main terminal of the first opposing switching device 146 etc., if the arm short circuit occurs, current flowing between the negative-side main terminal of the first switching device 142 and the positive-side main terminal of the first opposing switching device 146 etc. is smaller than that flowing between the negative-side main terminal of the second switching device 144 and the positive-side main terminal of the first opposing switching device 146 etc. As a result, the first detection value by the first detector 172 is lower than the second detection value by the second detector 174. Accordingly, when an overcurrent flows, if the first detection value is lower than the second detection value, the determining unit 124 can determine that an overcurrent flows in the opposing arm.

Because a wiring from two switching devices to the output terminal and a wiring from two switching devices to the opposing arm respectively have a different wire resistance in one arm, by comparing detection values of currents flowing in two switching devices, the switching apparatus 100 indicated above can identify whether the overcurrent due to the load short circuit flows or the overcurrent due to the arm short circuit of the opposing arm flows.

Note that, although in FIG. 1 the first current detecting resistor 182 and the first thermal diode 192 are both provided, only one of the first current detecting resistor 182 and the first thermal diode 192 may be provided. In a similar way, respectively, only one of; the second current detecting resistor 184 and the second thermal diode 194; the third current detecting resistor 186 and the third thermal diode 196; and the fourth current detecting resistor 188 and the fourth thermal diode 198 may be provided. Also, although in FIG. 1 the third current detecting resistor 186, the fourth current detecting resistor 188, the third thermal diode 196 and the fourth thermal diode 198 are provided, in the present embodiment, the third current detecting resistor 186, the fourth current detecting resistor 188, the third thermal diode 196 and the fourth thermal diode 198 may not be provided in the switching circuit 110.

Also, although in FIG. 1 the switching circuit 110 uses the sense terminal of the switching device for detecting current flowing in the switching device, alternatively, the switching circuit 110 may use a current sensor for detecting a magnetic field using a coil or a magnetic sensor.

Also, the determining unit 124 in FIG. 1 may function as a determination apparatus independent from the control device 120. In this case, the determination apparatus is connected to the switching apparatus 100, and as described above may use the first detection value and the second detection value to determine whether an overcurrent flows in the output terminal OUT or in the first opposing switching device 146 or the second opposing switching device 148.

Figure 2:
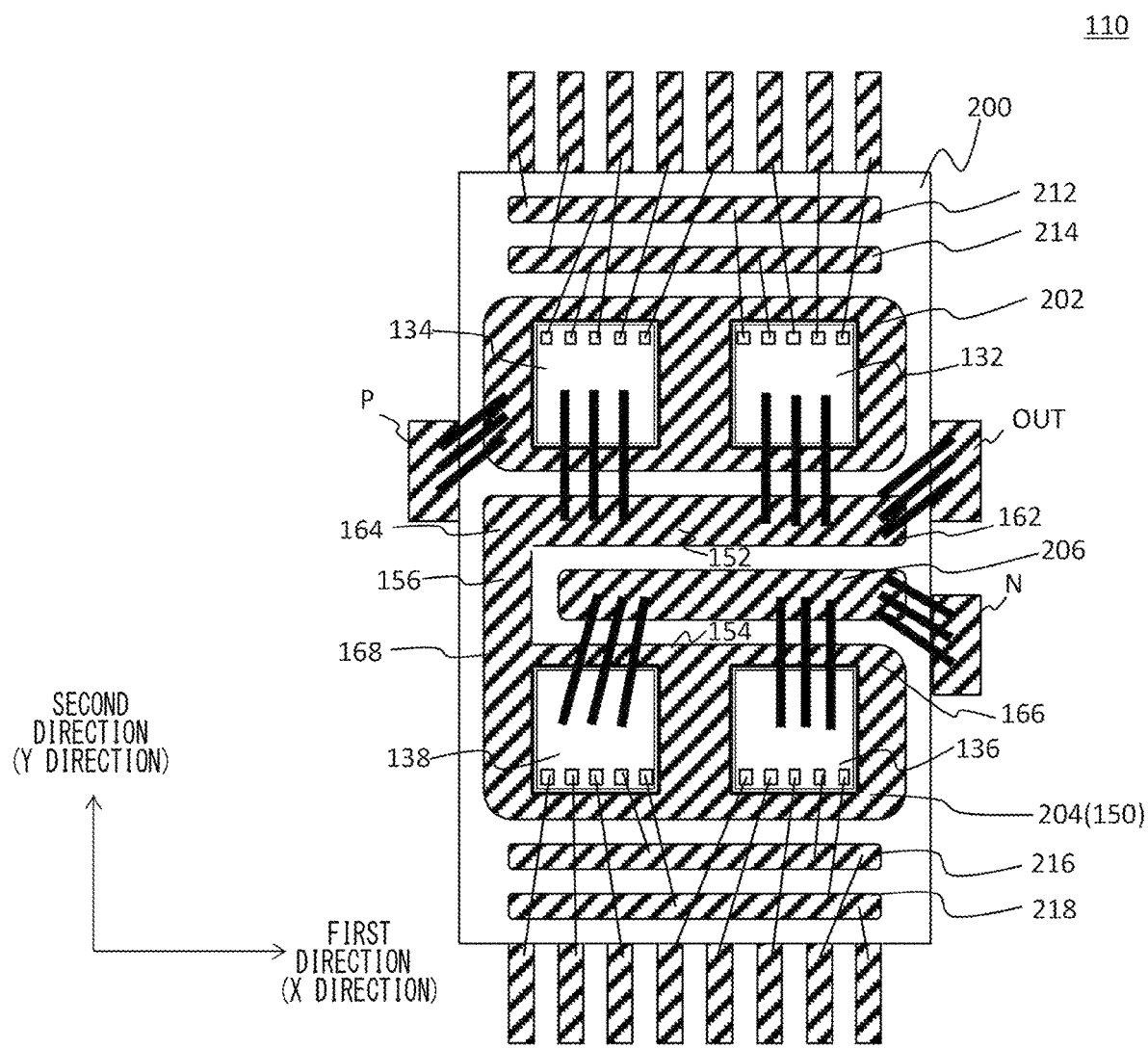
FIG. 2 shows an example of a circuit arrangement of the switching circuit according to the present embodiment.

FIG. 2 shows an example of a circuit arrangement of the switching circuit 110 according to the present embodiment. The switching circuit 110 further comprises a substrate 200 on which each of the members shown in FIG. 1 is mounted. In FIG. 2, identical signs are applied to similar elements to those shown in FIG. 1, and descriptions are omitted except for differences hereinafter. In this figure, for convenience of the description, the orientation from the left to the right of the drawing is indicated as a first direction or an X direction, and the orientation from the bottom to the top of the drawing is indicated as a second direction or a Y direction, which is perpendicular to the first direction.

The substrate 200 is an insulating substrate on which wiring patterns and terminals indicated by hatching are formed. The substrate 200 includes a first wiring pattern 202, a second wiring pattern 204, a third wiring pattern 206, a fourth wiring pattern 212, a fifth wiring pattern 214, a sixth wiring pattern 216 and a seventh wiring pattern 218.

The first wiring pattern 202 extends in the first direction on the substrate 200. On the first wiring pattern 202, along the first direction, the second switch 134 and the first switch 132 are mounted in this order. The first wiring pattern 202 is electrically connected to positive-side main terminals (drains or collectors) which are back surface electrodes of the first switch 132 and the second switch 134. Also, by means of wire bonding, the first wiring pattern 202 is connected to terminals for inputting a reference potential P formed on a negative side of the first direction on the substrate 200.

The second wiring pattern 204 corresponds to the output wiring section 150 in FIG. 1, and includes the first wiring 152, the second wiring 154 and the third wiring 156. The first wiring 152, on the substrate 200, is adjacent to the negative side of the second direction relative to the first wiring pattern 202 and extends in the first direction along the first wiring pattern 202. The first wiring 152 includes the first end 162 of the first switch 132 side (the positive side of the first direction in FIG. 2) and the second end 164 on the second switch 134 side (the negative side of the first direction in FIG. 2). The first wiring 152 is connected to the output terminal OUT on the first end 162 side by means of wire bonding and connected to the third wiring 156 on the second end 164 side. Also, the first wiring 152 is connected to a negative-side main terminal (a source or an emitter) of the first switch 132 by means of wire bonding on a side closer to the first end 162, and connected to a negative-side main terminal (a source or an emitter) of the second switch 134 by means of wire bonding on a side closer to the second end 164.

The second wiring 154 is, on the substrate 200, located to sandwich the third wiring pattern 206 with the first wiring 152, and extends in the first direction on the negative side of the second direction relative to the first wiring 152. On the second wiring 154, the second opposing switch 138 and the first opposing switch 136 are mounted along the first direction in this order. The second wiring 154 is electrically connected to positive-side main terminals (drains or collectors) which are back surface electrodes of the first opposing switch 136 and the second opposing switch 138. The second wiring 154 includes the first end 166 on the first opposing switch 136 side (the positive side of the first direction in FIG. 2) and the second end 168 on the second opposing switch 138 side (the negative side of the first direction in FIG. 2). The second wiring 154 is arranged to extend in parallel with the first direction in a manner that the first end 162 of the first wiring 152 and the first end 166 of the second wiring 154 as well as the second end 164 of the first wiring 152 and the second end 168 of the second wiring 154 respectively oppose each other. The second wiring 154 is connected to the third wiring 156 on the second end 168 side.

The third wiring 156 connects the second end 164 side of the first wiring 152 and the second end 168 side of the second wiring 154. The third wiring 156 is arranged adjacent to a side opposing to a side where the output terminal OUT of the substrate 200 is provided (the negative side of the first direction in FIG. 2), and extends in the second direction.

The third wiring pattern 206 extends in the first direction between the first wiring 152 and the second wiring 154 on the substrate 200. The third wiring pattern 206 is electrically connected to negative-side main terminals (sources or emitters) of the first opposing switch 136 and the second opposing switch 138 by means of wire bonding. Also, the third wiring pattern 206 is connected to terminals for inputting a reference potential N formed on a positive side of the first direction on the substrate 200 by means of wire bonding.

The fourth wiring pattern 212 is provided on a positive side of the second direction relative to the first wiring pattern 202 on the substrate 200 and extends in the first direction. The fourth wiring pattern 212 is connected to one of the terminals provided on the positive side of the second direction in the first switch 132, the second switch 134 and the substrate 200 by means of wire bonding. In the present embodiment, the fourth wiring pattern 212 may connect the negative-side main terminal (a source or an emitter) of the first switch 132 and the negative-side main terminal (a source or an emitter) of the second switch 134 to an identical terminal of the substrate 200.

The fifth wiring pattern 214 is provided between the fourth wiring pattern 212 and the first wiring pattern 202 on the substrate 200, and extends in parallel with the fourth wiring pattern 212 and the first wiring pattern 202 in the first direction. The fifth wiring pattern 214 is connected to one of the terminals provided on the positive side of the second direction in the first switch 132, the second switch 134 and the substrate 200 by means of wire bonding. In the present embodiment, the fifth wiring pattern 214 may connect a control terminal (a gate) of the first switch 132 and a control terminal (a gate) of the second switch 134 to an identical terminal of the substrate 200.

The sixth wiring pattern 216 is provided on a negative side of the second direction relative to the second wiring pattern 204 on the substrate 200 and extends in parallel with the second wiring pattern 204 in the first direction. The sixth wiring pattern 216 is connected to one of the terminals provided on the negative side of the second direction in the first opposing switch 136, the second opposing switch 138 and the substrate 200 by means of wire bonding. In the present embodiment, the sixth wiring pattern 216 may connect a control terminal (a gate) of the first opposing switch 136 and a control terminal (a gate) of the second opposing switch 138 to an identical terminal of the substrate 200.

The seventh wiring pattern 218 is provided on the negative side of the second direction relative to the sixth wiring pattern 216 on the substrate 200 and extends in parallel with the sixth wiring pattern 216 in the first direction. The seventh wiring pattern 218 is connected to one of the terminals provided on the negative side of the second direction in the first opposing switch 136, the second opposing switch 138 and the substrate 200 by the wire bonding. In the present embodiment, the seventh wiring pattern 218 may connect a negative-side main terminal (a source or an emitter) of the first opposing switch 136 and a negative-side main terminal (a source or an emitter) of the second opposing switch 138 to an identical terminal of the substrate 200.

Note that, on the positive side of the second direction of the substrate 200, six terminals are provided in addition to the two above-described terminals which are connected to the fourth wiring pattern 212 and the fifth wiring pattern 214. Three of these terminals are connected to the first switch 132 by the wire bonding, and the other three terminals are connected to the second switch 134 by the wire bonding. In the present embodiment, one of the three terminals which are connected to the first switch 132 may be connected to the sense terminal of the first switching device 142, and the other two terminals may be connected to the first thermal diode 192. Also, in the present embodiment, one of the three terminals connected to the second switch 134 may be connected to the sense terminal of the second switching device 144, and the other two terminals may be connected to the second thermal diode 194.

Also, on the negative side of the second direction on the substrate 200, six terminals are provided in addition to the above-described two terminals connected to the sixth wiring pattern 216 and the seventh wiring pattern 218. Three of these terminals are connected to the first opposing switch 136 by the wire bonding, and the other three terminals are connected to the second opposing switch 138 by the wire bonding. In the present embodiment, one of the three terminals which are connected to the first opposing switch 136 may be connected to the sense terminal of the first opposing switching device 146, and the other two terminals may be connected to the third thermal diode 196. Also, in the present embodiment, one of the three terminals which are connected to the second opposing switch 138 may be connected to the sense terminal of the second opposing switching device 148, and the other two terminals may be connected to the fourth thermal diode 198.

In the circuit arrangement shown in this figure, because a wiring between the negative-side main terminal of the first switching device 142 and the output terminal OUT is shorter than a wiring between the negative-side main terminal of the second switching device 144 and the output terminal OUT by a length of the first wiring 152, the wire resistance between the negative-side main terminal of the first switching device 142 and the output terminal OUT is lower than the wire resistance between the negative-side main terminal of the second switching device 144 and the output terminal OUT. Also, because the wiring between the negative-side main terminal of the first switching device 142 and the positive-side main terminal of the first opposing switching device 146 etc. is longer than the wiring between the negative-side main terminal of the second switching device 144 and the positive-side main terminal of the first opposing switching device 146 etc. by the length of the first wiring 152, the wire resistance between the negative-side main terminal of the first switching device 142 and the positive-side main terminal of the first opposing switching device 146 etc. is higher than the wire resistance between the negative-side main terminal of the second switching device 144 and the positive-side main terminal of the first opposing switching device 146 etc.

By using such differences of wire resistances, when the switching apparatus 100 detects that an overcurrent flows, if the first detection value corresponding to the current flowing in the first switching device 142 is larger than the second detection value corresponding to the current flowing in the second switching device 144, the switching apparatus 100 can determine that an overcurrent flows in the output terminal OUT, and if the first detection value is lower than the second detection value, the switching apparatus 100 can determine that an overcurrent flows in the opposing arm.

Figure 3:
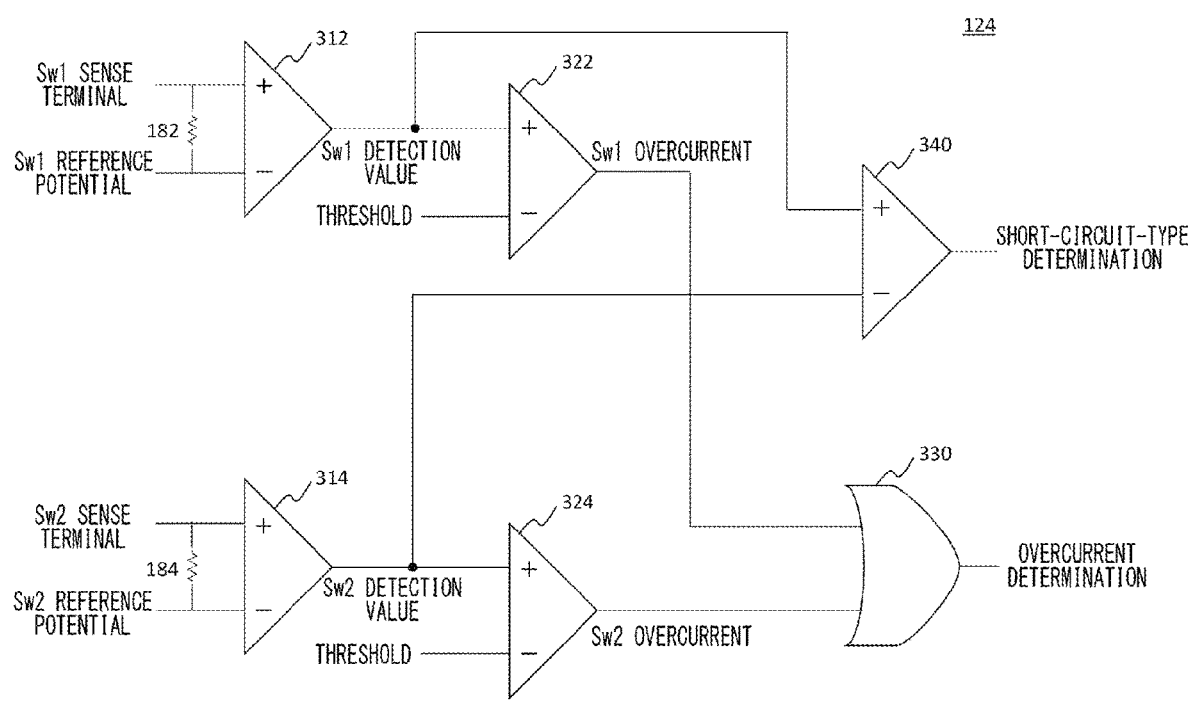
FIG. 3 shows an example of a configuration of a determining unit according to the present embodiment.

FIG. 3 shows an example of a configuration of the determining unit 124 according to the present embodiment. In the example of this figure, the determining unit 124 uses the first current detecting resistor 182 as the first detector 172 in FIG. 1 to obtain a first detection value ("Sw1 detection value" in the figure) corresponding to current flowing in the first switching device 142 ("Sw1" in the figure). Also, the determining unit 124 uses the second current detecting resistor 184 as the second detector 174 in FIG. 1 to obtain a second detection value ("Sw2 detection value" in the figure) corresponding to current flowing in the second switching device 144 ("Sw2" in the figure). The determining unit 124 includes a first amplifier 312, a second amplifier 314, a first comparator 322, a second comparator 324, an OR circuit 330 and a short-circuit determining comparator 340.

The first amplifier 312 is a differential amplifier, where a voltage from the sense terminal side of the first switching device 142 in the first current detecting resistor 182 is input to the positive terminal, and a voltage from the negative-side main terminal side is input to the negative terminal. The first amplifier 312 outputs, as a first detection value, a value gained by amplifying, with a predetermined amplification factor, a potential difference between both ends of the first current detecting resistor 182 (a voltage on the sense terminal side of the first current detecting resistor 182 in a case where the negative-side main terminal is used for a reference potential).

The second amplifier 314 is a differential amplifier, where a voltage from the sense terminal side of the second switching device 144 in the second current detecting resistor 184 is input to the positive terminal, and a voltage from the negative-side main terminal side is input to the negative terminal. The second amplifier 314 outputs, as a second detection value, a value gained by amplifying, with a predetermined amplification factor, a potential difference between both ends of the second current detecting resistor 184 (a voltage on the sense terminal side of the second current detecting resistor 184 in a case where the negative-side main terminal is used for a reference potential).

The first comparator 322 obtains the first detection value output from the first amplifier 312 as an input on the positive side and obtains a predetermined threshold as an input on the negative side, and outputs a comparison result of the first detection value and the threshold ("Sw1 overcurrent" in the figure) to the OR circuit 330. In the present embodiment, the threshold is an reference value for detecting that an overcurrent flows in the first switching device 142 using the first detection value. The first comparator 322 outputs a logic H (High) when the first detection value is higher than the threshold, which indicates that the overcurrent flows in the first switching device 142. Also, the first comparator 322 outputs a logic L (Low) when the first detection value is lower than the threshold, which indicates that the overcurrent does not flow in the first switching device 142.

The second comparator 324 obtains the second detection value output from the second amplifier 314 as an input on the positive side and obtains a predetermined threshold as an input on the negative side, and outputs a comparison result of the second detection value and the threshold ("Sw2 overcurrent" in the figure) to the OR circuit 330. In the present embodiment, the threshold is a reference value for detecting that an overcurrent flows in the second switching device 144 using the second detection value. When the second detection value is higher than the threshold, the second comparator 324 outputs the logic H (High), which indicates that the overcurrent flows in the second switching device 144. Also, when the second detection value is lower than the threshold, the second comparator 324 outputs the logic L (Low), which indicates that the overcurrent does not flow in the second switching device 144.

The OR circuit 330 obtains the comparison result output from the first comparator 322 and the comparison result output from the second comparator 324 as the inputs, and outputs the result of implementing a logical OR operation. When at least one of the outputs of the first comparator 322 and the second comparator 324 is the logic H (High), an output of the OR circuit 330 becomes the logic H (High), which indicates an overcurrent determining result that an overcurrent flows in the switching circuit 110.

The short-circuit determining comparator 340 obtains the first detection value output from the first amplifier 312 as an input on the positive side and obtains the second detection value output from the second amplifier 314 as an input on the negative side, and outputs a comparison result of the two detection values. The short-circuit determining comparator 340 outputs the logic H (High) when the first detection value is higher than the second detection value and outputs the logic L (Low) when the first detection value is lower than the second detection value.

Herein, as shown in FIG. 1 and FIG. 2, the wire resistance between the negative-side main terminal of the first switching device 142 and the output terminal OUT is lower than the wire resistance between the negative-side main terminal of the second switching device 144 and the output terminal OUT. Also, a wire resistance between the negative-side main terminal of the first switching device 142 and the opposing arm is higher than a wire resistance between the negative-side main terminal of the second switching device 144 and the opposing arm. Accordingly, because the current flowing in the first switching device 142 is larger than the current flowing in the second switching device 144 when the load short circuit occurs, the determining unit 124 outputs an overcurrent determining signal of the logic H from the OR circuit 330 and outputs a short-circuit-type determining signal of the logic H from the a short-circuit determining comparator 340, and thereby can indicate that the load short circuit occurs. Also, because the current flowing in the first switching device 142 is smaller than the current flowing in the second switching device 144 when the arm short circuit occurs, the determining unit 124 outputs the overcurrent determining signal of the logic H from the OR circuit 330 and outputs the short-circuit-type determining signal of the logic L from the short-circuit determining comparator 340, and thereby can indicate that the arm short circuit occurs.

The determining unit 124 indicated above can determine whether an overcurrent flows in at least one of the first switching device 142 and the second switching device 144 using the first detection value and the second detection value, and in the case where the overcurrent flows, can determine whether the load short circuit or the arm short circuit occurs, depending on whether a larger current flows in the first switching device 142 or the second switching device 144.

Note that, although in the example of this figure, the determining unit 124 uses the first current detecting resistor 182 as the first detector 172 and uses the second current detecting resistor 184 as the second detector 174, in the other embodiment, the determining unit 124 may use the first thermal diode 192 as the first detector 172 and use the second thermal diode 194 as the second detector 174, and, by using temperature detection values obtained therefrom as the first detection value and the second detection value, may adopt the configuration of making determinations by the first comparator 322, the second comparator 324, the OR circuit 330 and the short-circuit determining comparator 340.

Figure 4:
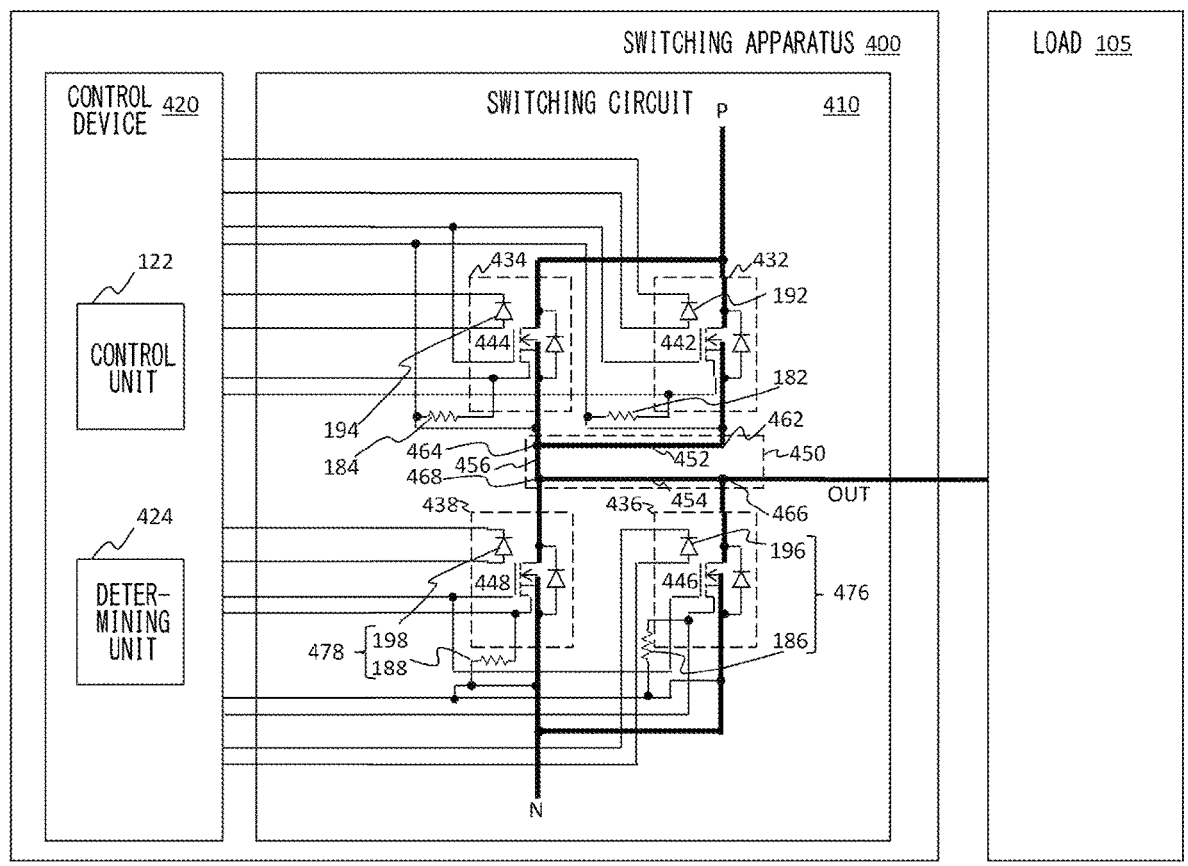
FIG. 4 shows a configuration of a switching apparatus according to a variation of the present embodiment with a load.

FIG. 4 shows a configuration of a switching apparatus 400 with the load 105 according to a variation of the present embodiment. The switching apparatus 400 according to the present variation is configured to be able to detect whether an overcurrent flows in a switch on an upper arm (an opposing arm) side or in the load 105 in accordance with the result of detecting currents flowing in two switches on a to-be-detected lower arm side. In FIG. 4, identical signs are applied to similar elements to those shown in FIG. 1 to FIG. 3, and descriptions are omitted except for differences hereinafter.

The switching apparatus 400 comprises a switching circuit 410 and a control device 420. The switching circuit 410 includes a first opposing switch 432, a second opposing switch 434, a first switch 436, a second switch 438, the first current detecting resistor 182, the second current detecting resistor 184, the third current detecting resistor 186, the fourth current detecting resistor 188 and an output wiring section 450. Herein, the first opposing switch 432 and the second opposing switch 434 have functions and configurations similar to the first switch 132 and the second switch 134 except for being named "opposing switch" because of being switches of an upper arm, which is an opposing arm, and except for a connection form to the output wiring section 450. The first switch 436 and the second switch 438 have functions and configurations similar to the first opposing switch 136 and the second opposing switch 138 except for being named "switch" because of being switches of a to-be-detected lower arm and except for a connection form to the output wiring section 450. Also, in the present variation, the reference potential N is an example of the first reference potential, and the reference potential P is an example of the second reference potential.

The output wiring section 450 includes a first wiring 454, a second wiring 452 and a third wiring 456. The first wiring 454 is a wiring on a lower arm side of the output wiring section 450 and connects a positive-side main terminal of a first switching device 446, a positive-side main terminal of a second switching device 448 and the output terminal OUT. In the present variation, the positive-side main terminal is an example of the second main terminal. The first wiring 454 includes a first end 466 and a second end 468. The positive-side main terminal of the first switching device 446 is connected to the first wiring 454 at a point closer to the first end 466 than the positive-side main terminal of the second switching device 448. In the present variation, the positive-side main terminal of the first switching device 446 is connected to the first end 466, and the positive-side main terminal of the second switching device 448 is connected to the second end 468. The output terminal OUT is connected to the first end 466 side of the first wiring 454. The first opposing switching device 442 and the second opposing switching device 444 are connected to the second end 468 side of the first wiring 454.

The second wiring 452 is a wiring on an upper arm side of the output wiring section 450 and connects a negative-side main terminal of the first opposing switching device 442 and a negative-side main terminal of the second opposing switching device 444. In the present variation, the negative-side main terminal is an example of the first main terminal. The second wiring 452 includes a first end 462 and a second end 464. The negative-side main terminal of the first opposing switching device 442 is connected to the second wiring 452 at a point closer to the first end 462 than the negative-side main terminal of the second opposing switching device 444.

The third wiring 456 is a wiring which connects the upper arm side and the lower arm side and connects the second end 468 side of the first wiring 454 and the second end 464 side of the second wiring 452.

In the present variation, while the positive-side main terminal of the first switching device 446 and the output terminal OUT are connected without interposing the first wiring 454, the first wiring 454 is provided between the positive-side main terminal of the second switching device 448 and the output terminal OUT. Thus, a wiring between the positive-side main terminal of the first switching device 446 and the output terminal OUT is shorter than a wiring between the positive-side main terminal of the second switching device 448 and the output terminal OUT. Thereby, in the present variation, a wire resistance between the positive-side main terminal of the first switching device 446 and the output terminal OUT is lower than a wire resistance between the positive-side main terminal of the second switching device 448 and the output terminal OUT. In this manner, a wire resistance from the first end 466 of the first wiring 454 to the reference potential N via the second switching device 448 can be set higher than that via the first switching device 446.

Also, in the present variation, while the first wiring 454 is provided between the positive-side main terminal of the first switching device 446 and the negative-side main terminal of the first opposing switching device 442 etc., the first wiring 454 is not provided between the positive-side main terminal of the second switching device 448 and the negative-side main terminal of the first opposing switching device 442 etc. Thus, a wiring between the positive-side main terminal of the first switching device 446 and the negative-side main terminal of the first opposing switching device 442 etc. is longer than a wiring between the positive-side main terminal of the second switching device 448 and the negative-side main terminal of the first opposing switching device 442 etc. Thereby, in the present variation, a wire resistance between the positive-side main terminal of the first switching device 446 and the negative-side main terminal of the first opposing switching device 442 etc. is higher than a wire resistance between the positive-side main terminal of the second switching device 448 and the negative-side main terminal of the first opposing switching device 442 etc. In this manner, a wire resistance from the second end 464 of the second wiring 452 to the reference potential N via the second switching device 448 can be set lower than that via the first switching device 446.

The control device 420 is similar to the control device 120 shown in FIG. 1 except for having a determining unit 424 instead of the determining unit 124, and thus descriptions are omitted except for differences hereinafter. The determining unit 424 is connected to at least one of the third current detecting resistor 186 and the third thermal diode 196 and at least one of the fourth current detecting resistor 188 and the fourth thermal diode 198. The determining unit 424 uses at least one of the third current detecting resistor 186 and the third thermal diode 196 as a first detector 476 to obtain the a first detection value corresponding to current flowing in the first switching device 446. The determining unit 424 uses at least one of the fourth current detecting resistor 188 and the fourth thermal diode 198 as a second detector 478 to obtain a second detection value corresponding to current flowing in the second switching device 448.

The determining unit 424 uses the first detection value and the second detection value, in a similar way to the determining unit 124. to determine whether an overcurrent flows in the output terminal OUT or in the opposing arm (upper arm in this figure) including the first opposing switching device 442 and the second opposing switching device 444.

By comparing detection values of currents flowing in two switching devices on the lower arm side, the switching apparatus 400 indicated above can identify whether an overcurrent due to the load short circuit flows or the overcurrent due to the arm short circuit of the opposing arm flows.

Figure 5:
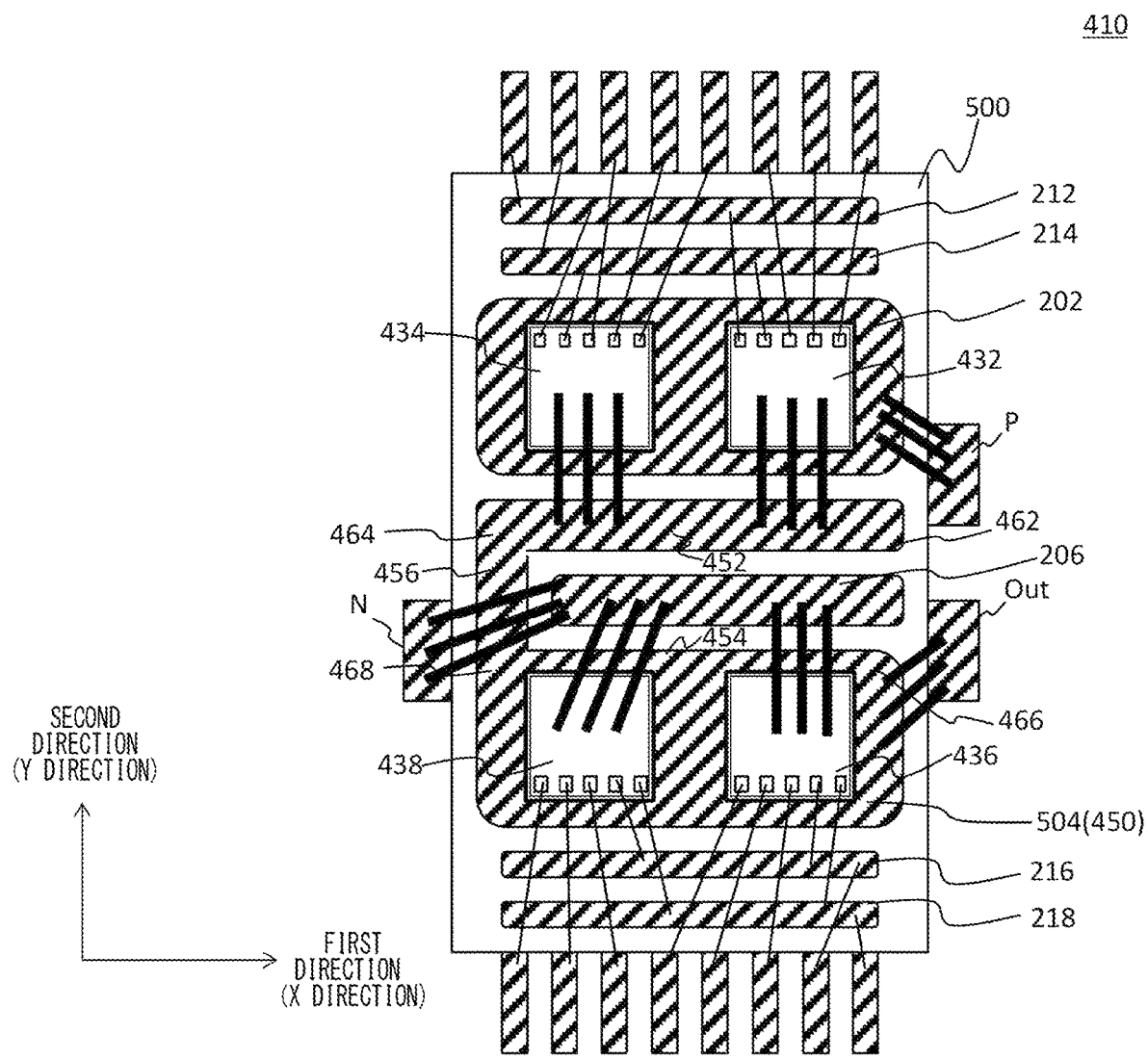
FIG. 5 shows an example of a circuit arrangement of the switching circuit according to the variation of the present embodiment.

FIG. 5 shows an example of a circuit arrangement of the switching circuit 410 according to the variation of the present embodiment. The switching circuit 410 further includes a substrate 500 on which each of the members shown in FIG. 4 is mounted. In FIG. 5, identical signs are applied to similar elements indicated in FIG. 2 and FIG. 4, and descriptions are omitted except for differences hereinafter.

The substrate 500 is an insulating substrate on which wiring patterns and terminals indicated by hatching are formed. The substrate 500 includes the first wiring pattern 202, a second wiring pattern 504, the third wiring pattern 206, the fourth wiring pattern 212, the fifth wiring pattern 214, the sixth wiring pattern 216 and the seventh wiring pattern 218.

In the present variation, the first wiring pattern 202 is similar to the first wiring pattern 202 in FIG. 2 except for being connected to terminals for inputting the reference potential P formed on the positive side of the first direction on the substrate 500.

The second wiring pattern 504 corresponds to the output wiring section 450 in FIG. 4 and includes the first wiring 454, the second wiring 452 and the third wiring 456. Herein, the second wiring pattern 504 has a patterned shape similar to the second wiring pattern 204 in FIG. 2, and the first wiring 454 corresponds to the second wiring 154 of the second wiring pattern 204, the second wiring 452 corresponds to the first wiring 152 of the second wiring pattern 204, and the third wiring 456 corresponds to the third wiring 156 of the second wiring pattern 204.

The first wiring 454, on the substrate 500, is located to sandwich the third wiring pattern 206 with the second wiring 452 and extends in the first direction on the negative side of the second direction relative to the second wiring 452. On the first wiring 454, the second switch 438 and the first switch 436 are mounted along the first direction in this order. The first wiring 454 is electrically connected to positive-side main terminals (drains or collectors) which are back surface electrodes of the first switch 436 and the second switch 438. The first wiring 454 includes the first end 466 on the first switch 436 side (the positive side of the first direction in FIG. 5) and the second end 468 in the second switch 438 side (the negative side of the first direction in FIG. 5). The first wiring 454 is connected to the output terminal OUT by the wire bonding on the first end 466 side and connected to the third wiring 456 on the second end 468 side.

The second wiring 452, on the substrate 500, is adjacent to the negative side of the second direction relative to the first wiring pattern 202 and extends in the first direction along the first wiring pattern 202. The second wiring 452 includes the first end 462 on the first opposing switch 432 side (the positive side of the first direction in FIG. 5) and the second end 464 on the second opposing switch 434 side (the negative side of the first direction in FIG. 5). The second wiring 452 is connected to the third wiring 456 on the second end 464 side. Also, the second wiring 452 is connected to a negative-side main terminal (a source or an emitter) of the first opposing switch 432 by the wire bonding on a side closer to the first end 462, and connected to a negative-side main terminal (a source or an emitter) of the second opposing switch 434 by the wire bonding on a side closer to the second end 464.

In the present variation, the third wiring pattern 206 is similar to the third wiring pattern 206 in FIG. 2 except for being connected to a terminals for inputting the reference potential N formed on the negative side of the first direction on the substrate 500.

In the circuit arrangement shown in this figure, because a wiring between the positive-side main terminal of the first switching device 446 and the output terminal OUT is shorter than a wiring between the positive-side main terminal of the second switching device 448 and the output terminal OUT by a length of the first wiring 454, the wire resistance between the positive-side main terminal of the first switching device 446 and the output terminal OUT is lower than the wire resistance between the positive-side main terminal of the second switching device 448 and the output terminal OUT. Also, because the wiring between the positive-side main terminal of the first switching device 446 and the negative-side main terminal of the first opposing switching device 442 etc. is longer than the wiring between the positive-side main terminal of the second switching device 448 and the negative-side main terminal of the first opposing switching device 442 etc. by the length of the first wiring 454, the wire resistance between the positive-side main terminal of the first switching device 446 and the negative-side main terminal of the first opposing switching device 442 etc. is higher than the wire resistance between the positive-side main terminal of the second switching device 448 and the negative-side main terminal of the first opposing switching device 442 etc.

By using such differences of wire resistances, when the switching apparatus 400 detects that an overcurrent flows, the switching apparatus 400 can determine that an overcurrent flows in the output terminal OUT if the first detection value corresponding to the current flowing in the first switching device 446 is higher than the second detection value corresponding to the current flowing in the second switching device 448, and can determine that an overcurrent flows in the upper arm (the opposing arm) if the first detection value is lower than the second detection value.

Figure 6:
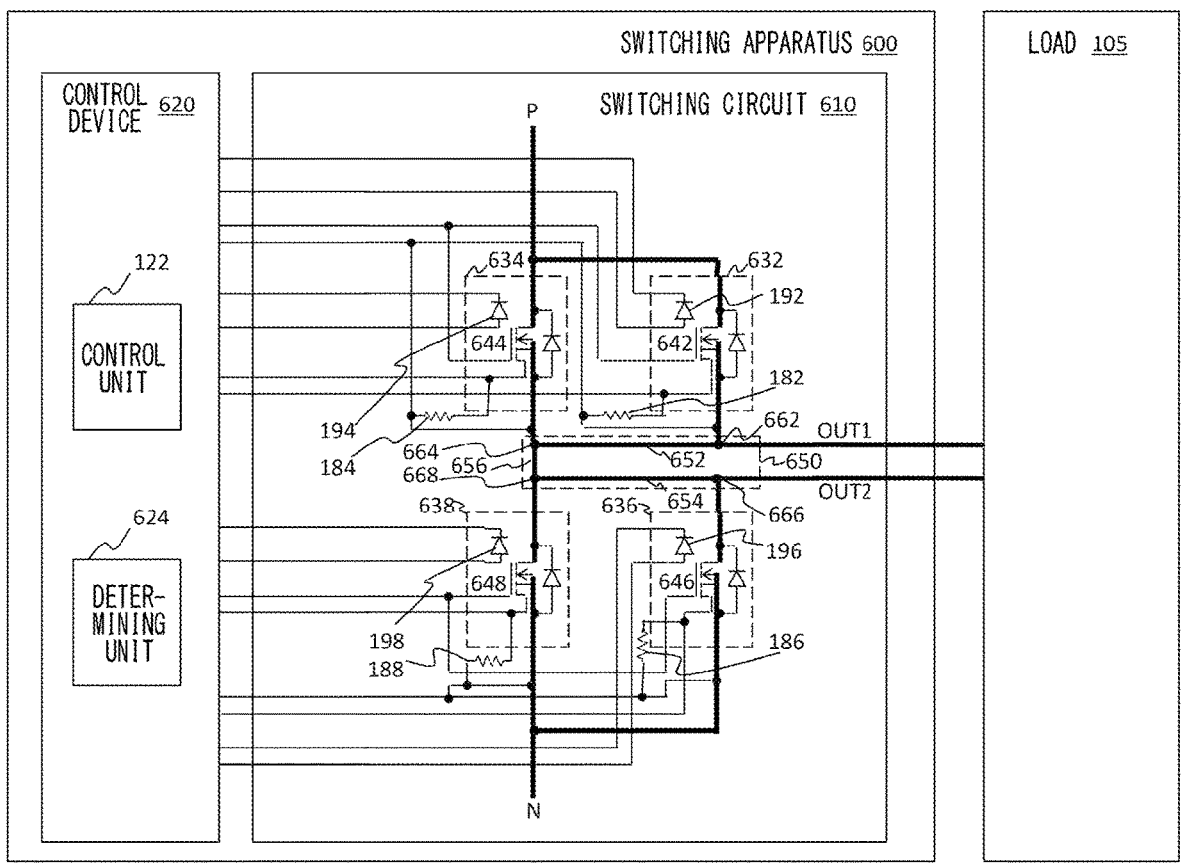
FIG. 6 shows a configuration of a switching apparatus according to a second variation of the present embodiment with a load.

FIG. 6 shows a configuration of a switching apparatus 600 according to a second variation of the present embodiment with the load 105. The switching apparatus 600 according to the present variation is configured to be able to detect whether an overcurrent flows in a switch on a lower arm (an opposing arm) side or in the load 105 in accordance with a result obtained by detecting currents flowing in two switches on a to-be-detected upper arm side and to detect whether an overcurrent flows in a switch on an upper arm (an opposing arm) side or in the load 105 in accordance with a result obtained by detecting currents flowing in two switches on a to-be-detected lower arm side. In FIG. 6, identical signs are applied to similar elements to those shown in FIG. 1 to FIG. 5, and descriptions are omitted except for differences hereinafter.

The switching apparatus 600 includes a switching circuit 610 and a control device 620. The switching circuit 610 includes a first switch 632, a second switch 634, a third switch 636, a fourth switch 638, the first current detecting resistor 182, the second current detecting resistor 184, the third current detecting resistor 186, the fourth current detecting resistor 188 and a output wiring section 650. Herein, because the first switch 632, the second switch 634, the third switch 636 and the fourth switch 638, except for a connection form to the output wiring section 650, respectively have functions and a configuration similar to the first switch 132, the second switch 134, the first opposing switch 136 and the second opposing switch 138 shown in FIG. 1 when using two switches on the upper arm side as detection targets, and respectively have functions and a configuration similar to the first opposing switch 432, the second opposing switch 434, the first switch 436 and the second switch 438 shown in FIG. 4 when using two switches on the lower arm side as detection targets, descriptions are omitted except for differences hereinafter.

The output wiring section 650 connects a negative-side main terminal of a first switching device 642, a negative-side main terminal of a second switching device 644, a positive-side main terminal of a third switching device 646, a positive-side main terminal of a fourth switching device 648, a output terminal OUT 1 and an output terminal OUT 2. In the present variation, the output terminal OUT 1 and the output terminal OUT 2 are connected to an identical terminal of the load 105.

A first wiring 652 is a wiring on the upper arm side of the output wiring section 650 and connects the negative-side main terminal of the first switching device 642, the negative-side main terminal of the second switching device 644 and the output terminal OUT 1. The output terminal OUT 1 is connected to a first end 662 side of the first wiring 652.

A second wiring 654 is a wiring on the lower arm side of the output wiring section 650 and connects the positive-side main terminal of the third switching device 646, the positive-side main terminal of the fourth switching device 648 and the output terminal OUT 2. The output terminal OUT 2 is connected to a first end 666 side of the second wiring 654. Herein, the output terminal OUT 1 and the output terminal OUT 2 are electrically connected outside the switching apparatus 600 and connected to the load 105.

The control device 620 is similar to the control device 120 shown in FIG. 1 except for having a determining unit 624 instead of the determining unit 124, and thus descriptions are omitted except for differences hereinafter. The determining unit 624 determines whether an overcurrent flows in the output terminal OUT 1 or in the lower arm (the opposing arm) when two switches on the upper arm side (the first switch 632 and the second switch 634 in FIG. 6) are on, and two switches on the lower arm side (the third switch 636 and the fourth switch 638 in FIG. 6) are off, and determines whether an overcurrent flows in the output terminal OUT 2 or in the upper arm (the opposing arm) when two switches on the lower arm side are on, and two switches on the upper arm side are off. The determining unit 624 is connected to at least one of the first current detecting resistor 182 and the first thermal diode 192, at least one of the second current detecting resistor 184 and the second thermal diode 194, at least one of the third current detecting resistor 186 and the third thermal diode 196, and at least one of the fourth current detecting resistor 188 and the fourth thermal diode 198.

When two switches on the upper arm side are on, and two switches on the lower arm side are off, the determining unit 624 uses at least one of the first current detecting resistor 182 and the first thermal diode 192 as the first detector to obtain a first detection value corresponding to current flowing in the first switching device 642. The determining unit 424 uses at least one of the second current detecting resistor 184 and the second thermal diode 194 as the second detector to obtain a second detection value corresponding to current flowing in the second switching device 644. The determining unit 624 uses the first detection value and the second detection value, in a similar way to the determining unit 124 shown in the FIG. 1, to determine whether an overcurrent flows in the output terminal OUT 1 or in the opposing arm (the lower arm in the example of this figure), including the third switching device 646 and the fourth switching device 648.

Also, when two switches on the lower arm side are on, and two switches on the upper arm side are off, the determining unit 624 uses at least one of the third current detecting resistor 186 and the third thermal diode 196 as the first detector to obtain a first detection value corresponding to the current flowing in the third switching device 646. The determining unit 624 uses at least one of the fourth current detecting resistor 188 and the fourth thermal diode 198 as the second detector to obtain a second detection value corresponding to the current flowing in the fourth switching device 648. The determining unit 424 uses the first detection value and the second detection value, in a similar way to the determining unit 424 shown in FIG. 4, to determine whether an overcurrent flows in the output terminal OUT 2 or in the opposing arm (the upper arm in the example of this figure) including the first switching device 642 and the second switching device 644.

In the present variation, in the switching apparatus 600, when two switches on the upper arm side are on, and two switches on the lower arm side are off, in a similar way to the switching apparatus 100 shown in FIG. 1, the first wiring 652 functions as the first wiring 152 in FIG. 1 and the second wiring 654 functions as the second wiring 154 in FIG. 1. Thereby, the switching apparatus 600 can detect whether an overcurrent flows in the switch on the lower arm (the opposing arm) side or in the load 105. Also, in the switching apparatus 600, when two switches on the lower arm side are on, and two switches on the upper arm side are off, in a similar way to the switching apparatus 400 shown in FIG. 4, the second wiring 654 functions as the first wiring 454 in FIG. 4, and the first wiring 652 functions as the second wiring 452 in FIG. 4. In this manner, the switching apparatus 600 can detect whether an overcurrent flows in the switch on the upper arm (the opposing arm) side or in the load 105.

Because a wiring from two switching devices to the output terminal OUT 1 and the output terminal OUT 2 and a wiring from two switching devices to the opposing arm respectively have a different wire resistance in the upper arm and the lower arm, by comparing the detection values of currents flowing in two switching devices of the upper arm or the lower arm, the switching apparatus 600 indicated above can identify whether the overcurrent due to the load short circuit flows or the overcurrent due to the arm short circuit of the opposing arm flows.

Figure 7:
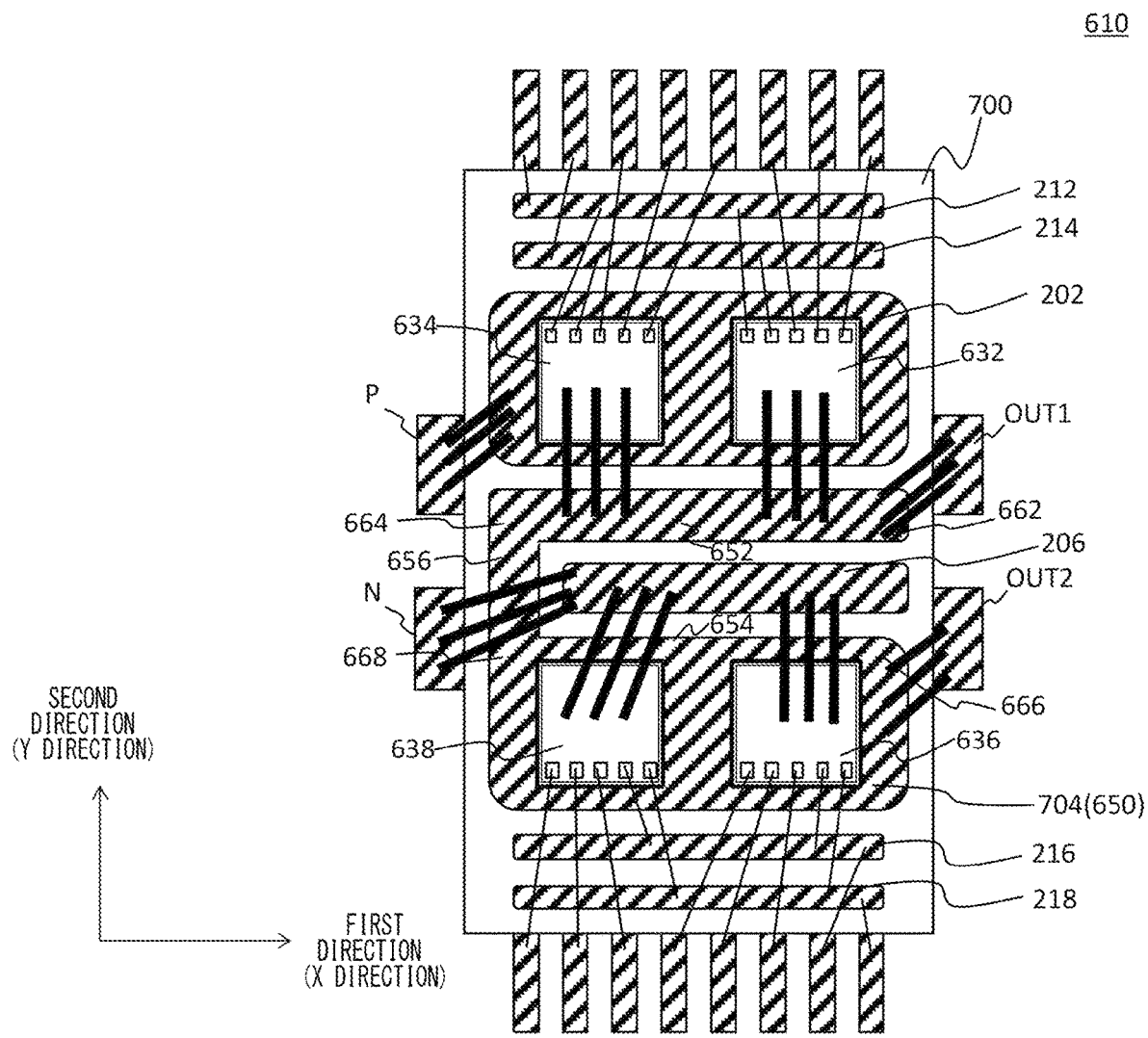
FIG. 7 shows an example of a circuit arrangement of the switching circuit according to the second variation of the present embodiment.

FIG. 7 shows an example of a circuit arrangement of the switching circuit 610 according to the second variation of the present embodiment. The switching circuit 610 further comprises a substrate 700 on which each of the members shown in FIG. 6 is mounted. In FIG. 7, identical signs are applied to similar elements to those shown in FIG. 2 and FIG. 6, and descriptions are omitted except for differences hereinafter.

The substrate 700 is an insulating substrate on which wiring patterns and terminals indicated by hatching are formed. The substrate 700 includes the first wiring pattern 202, a second wiring pattern 704, the third wiring pattern 206, the fourth wiring pattern 212, the fifth wiring pattern 214, the sixth wiring pattern 216 and the seventh wiring pattern 218.

The second wiring pattern 704 corresponds to the output wiring section 650 in FIG. 6 and includes the first wiring 652, the second wiring 654 and the third wiring 656. Herein, the second wiring pattern 704 has a patterned shape similar to the second wiring pattern 204 in FIG. 2, and the first wiring 652 corresponds to the first wiring 152 of the second wiring pattern 204, the second wiring 654 corresponds to the second wiring 154 of the second wiring pattern 204, and the third wiring 656 corresponds to the third wiring 156 of the second wiring pattern 204.

The first wiring 652, on the substrate 700, is adjacent to the negative side of the second direction relative to the first wiring pattern 202 and extends in the first direction along the first wiring pattern 202. The first wiring 652 includes the first end 662 on the first switch 632 side (the positive side of the first direction in FIG. 7) and the second end 664 on the second switch 634 side (the negative side of the first direction in FIG. 7). The first wiring 652 is connected to the output terminal OUT 1 on the first end 662 side by the wire bonding and connected to the third wiring 656 on the second end 664 side. Also, the first wiring 652 is connected to the negative-side main terminal (a source or an emitter) of the first switch 632 by the wire bonding on a side closer to the first end 662 and connected to the negative-side main terminal (a source or an emitter) of the second switch 634 by the wire bonding on a side closer to the second end 664.

The second wiring 654, on the substrate 700, is located to sandwich the third wiring pattern 206 with the first wiring 652 and extends in the first direction on the negative side of the second direction relative to the first wiring 652. On the second wiring 654, the fourth switch 638 and the third switch 636 are mounted along the first direction in this order. The second wiring 654 is electrically connected to the positive-side main terminals (drains or collectors) which are back surface electrodes of the third switch 636 and the fourth switch 638. The second wiring 654 includes the first end 666 on the third switch 636 side (the positive side of the first direction in FIG. 7) and the second end 668 on the fourth switch 638 side (the negative side of the first direction in FIG. 7). The second wiring 654 is connected to the output terminal OUT 2 on the first end 666 side by the wire bonding and connected to the third wiring 656 on the second end 668 side.

In the present variation, the third wiring pattern 206 is similar to the third wiring pattern 206 in FIG. 2 except for being connected to terminals for inputting the reference potential N formed on the negative side of the first direction on the substrate 700.

In the circuit arrangement shown in this figure, in a similar way to the circuit arrangement of the switching circuit 110 shown in FIG. 2, a wire resistance between the negative-side main terminal of the first switching device 642 and the output terminal OUT 1 is lower than a wire resistance between the negative-side main terminal of the second switching device 644 and the output terminal OUT 1, and also a wire resistance between the negative-side main terminal of the first switching device 642 and the positive-side main terminal of the third switching device 646 etc. is higher than a wire resistance between the negative-side main terminal of the second switching device 644 and the positive-side main terminal of the third switching device 646 etc. By using such differences of wire resistances, when the switching apparatus 600 detects that an overcurrent flows in the case where two switches on the upper arm side, which are the first switch 632 and the second switch 634 in FIG. 7, are on and two switches on the lower arm side (the third switch 636 and the fourth switch 638 in FIG. 7) are off, the switching apparatus 600 can determine that an overcurrent flows in the output terminal OUT 1 if the first detection value corresponding to the current flowing in the first switching device 642 is higher than the second detection value corresponding to the current flowing in the second switching device 644, and can determine that an overcurrent flows in the lower arm, which is an opposing arm, if the first detection value is lower than the second detection value.

Also, in the circuit arrangement shown in this figure, in a similar way to the circuit arrangement of the switching circuit 410 shown in FIG. 5, a wire resistance between the positive-side main terminal of the third switching device 646 and the output terminal OUT 2 is lower than a wire resistance between the positive-side main terminal of the fourth switching device 648 and the output terminal OUT 2, and also a wire resistance between the positive-side main terminal of the third switching device 646 and the negative-side main terminal of the first switching device 642 etc. is higher than a wire resistance between the positive-side main terminal of the fourth switching device 648 and the negative-side main terminal of the first switching device 642 etc. By using such differences of wire resistances, when the switching apparatus 600 detects that an overcurrent flows in the case where two switches on the lower arm side are on and two switches on the upper arm side are off, the switching apparatus 600 can determine that an overcurrent flows in the output terminal OUT 2 if the first detection value corresponding to the current flowing in the third switching device 646 is higher than the second detection value corresponding to the current flowing in the fourth switching device 648, and can determine that an overcurrent flows in the upper arm, which is the opposing arm, if the first detection value is lower than the second detection value.

Figure 8:
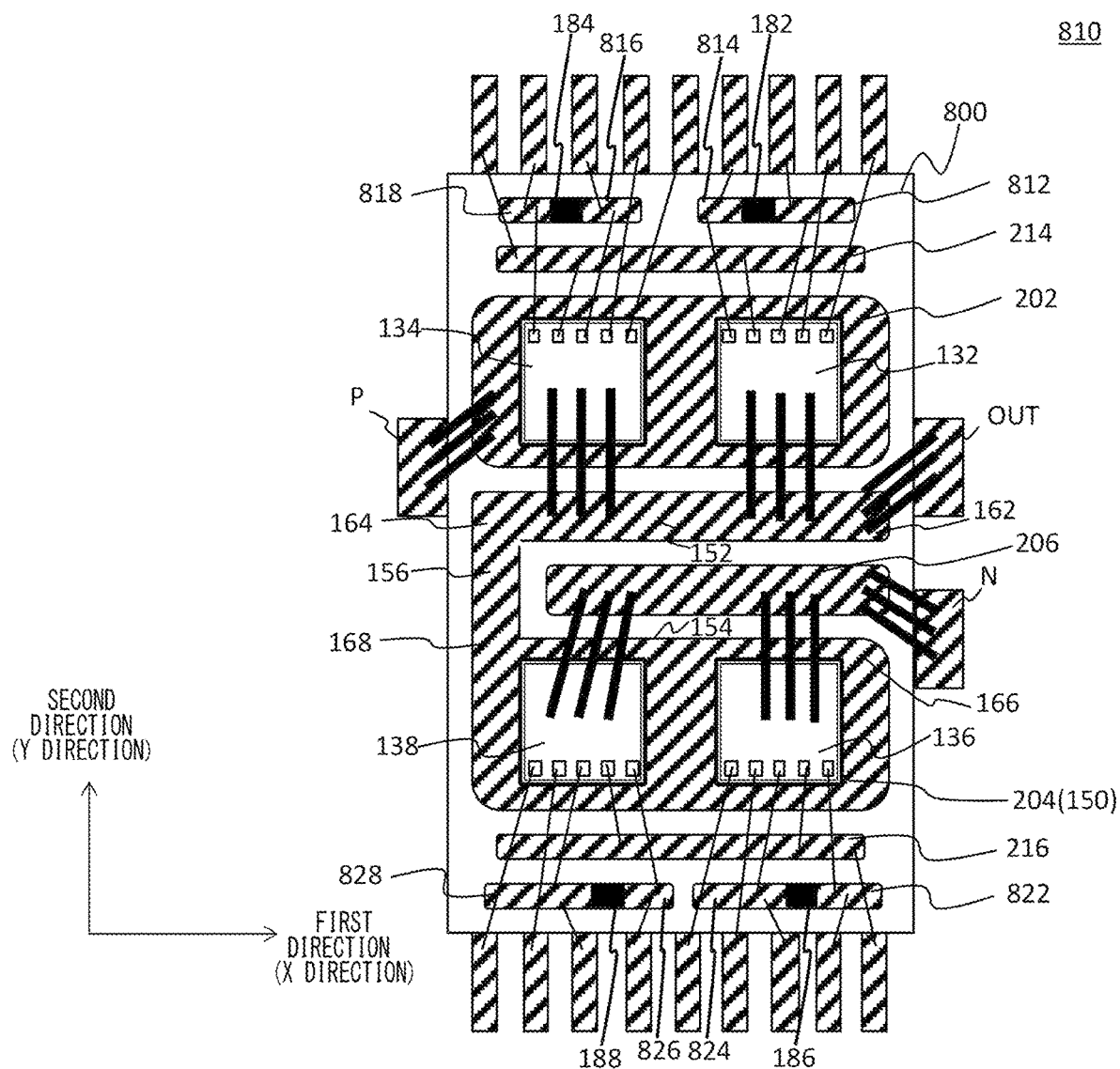
FIG. 8 shows an example of a circuit arrangement of a switching circuit according to a third variation of the present embodiment.

FIG. 8 shows an example of a circuit arrangement of the switching circuit 810 according to a third variation of the present embodiment. Because the switching circuit 810 is a variation of the switching circuit 110 shown in FIG. 1 and FIG. 2, identical signs are applied to similar elements shown in FIG. 1 and FIG. 2, and descriptions are omitted except for differences hereinafter.

The switching circuit 810 comprises a substrate 800 on which each of the members is mounted. The substrate 800 is a variation of the substrate 200 shown in FIG. 2 and, instead of the fourth wiring pattern 212 and the seventh wiring pattern 218, includes an eighth wiring pattern 812, a ninth wiring pattern 814, the first current detecting resistor 182, a tenth wiring pattern 816, an eleventh wiring pattern 818, the second current detecting resistor 184, a twelfth wiring pattern 822, a thirteenth wiring pattern 824, the third current detecting resistor 186, a fourteenth wiring pattern 826, a fifteenth wiring pattern 828 and the fourth current detecting resistor 188.

The eighth wiring pattern 812 and the ninth wiring pattern 814 are respectively provided on the positive side of the second direction relative to the first wiring pattern 202 on the substrate 800. The eighth wiring pattern 812 is connected to the sense terminal of the first switching device 142 by the wire bonding. Also, the eighth wiring pattern 812 is connected to a terminal for a sense output of the first switching device 142, which is provided on the positive side end of the second direction on the substrate 800 by the wire bonding. The ninth wiring pattern 814 is connected to the negative-side main terminal of the first switching device 142 by the wire bonding. Also, the ninth wiring pattern 814 is connected to a terminal for a level output of the negative-side main terminal of the first switching device 142, which is provided on the positive side end of the second direction on the substrate 800 by the wire bonding.

Between the eighth wiring pattern 812 and the ninth wiring pattern 814 on the substrate 800, the first current detecting resistor 182 is connected. In the present embodiment, the first current detecting resistor 182 may be a chip-type resistor. Thereby, the determining unit 124 of the control device 120 can measure a voltage between the terminal for the sense output and the terminal for the level output of the negative-side main terminal which are provided on an upper side end in the figure of the substrate 800 to measure current flowing in the first switch 132.

In a similar way that the eighth wiring pattern 812, the ninth wiring pattern 814 and the first current detecting resistor 182 are provided for the first switching device 142, the tenth wiring pattern 816, the eleventh wiring pattern 818 and the second current detecting resistor 184 are provided for the second switching device 144; the twelfth wiring pattern 822, the thirteenth wiring pattern 824 and the third current detecting resistor 186 are provided for the first opposing switching device 146; the fourteenth wiring pattern 826, the fifteenth wiring pattern 828 and the fourth current detecting resistor 188 are provided for the second opposing switching device 148. Herein, a terminal for a sense output and a terminal for a level output of the negative-side main terminal of the first opposing switching device 146 as well as a terminal for a sense output and a terminal for a level output of the negative-side main terminal which are of the second opposing switching device 148 are provided on the lower side end in the figure of the substrate 800.

In the present variation, by mounting the first current detecting resistor 182 on the eighth wiring pattern 812 and the ninth wiring pattern 814 on the substrate 800, current flowing in the first switching device 142 can be measured at the vicinity of the first switching device 142. This is the same for the second switching device 144, the first opposing switching device 146 and the second opposing switching device 148. Also, negative-side main terminals of the first switching device 142 and the second switching device 144 are not connected to each other by the fourth wiring pattern 212 on the substrate 200, and a bypass current that flows between these negative-side main terminals by bypassing and without flowing through the first wiring 152, can be greatly reduced. Note that, the first current detecting resistor 182, the second current detecting resistor 184, the third current detecting resistor 186, and the fourth current detecting resistor 188 may also be provided for the switching circuit 410 shown in FIG. 5 and for the switching circuit 610 shown in FIG. 7 in a configuration similar to the present variation.

Hereinabove, although embodiments of the present invention have been described, the technical scope of the present invention is not limited to the scope described in above-mentioned embodiments. It is apparent to those skilled in the art that various alterations and improvements can be added to the above-mentioned embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings for convenience, it does not necessarily mean that the process must be performed in this order.

What is claimed is:

1. A switching apparatus comprising:
   a first switching device and a second switching device, each including a first main terminal and a second main terminal, wherein the first main terminal is connected to a first reference potential;
   an opposing switching device including a first main terminal and a second main terminal, wherein the second main terminal is connected to a second reference potential;
   an output wiring section for connecting the second main terminal of the first switching device, the second main terminal of the second switching device, the first main terminal of the opposing switching device and an output terminal, wherein a wire resistance between the second main terminal of the first switching device and the output terminal is lower than a wire resistance between the second main terminal of the second switching device and the output terminal, and a wire resistance between the second main terminal of the first switching device and the first main terminal of the opposing switching device is higher than a wire resistance between the second main terminal of the second switching device and the first main terminal of the opposing switching device;
   a first detector for detecting a first detection value changing in accordance with current flowing in the first switching device; and
   a second detector for detecting a second detection value changing in accordance with current flowing in the second switching device.

2. The switching apparatus according to claim 1, further comprising a determining unit for determining whether an overcurrent flows in the output terminal or in the opposing switching device by using the first detection value and the second detection value.

3. The switching apparatus according to claim 2, wherein the determining unit is for:
   determining that an overcurrent flows in the output terminal according to that current flowing in the first switching device is larger than current flowing in the second switching device, and an overcurrent flows in the first switching device; and
   determining that an overcurrent flows in the opposing switching device according to that the current flowing in the second switching device is larger than the current flowing in the first switching device, and an overcurrent flows in the second switching device.

4. The switching apparatus according to claim 3, wherein
   the first detector includes a current sensor for detecting the first detection value corresponding to current flowing in the first switching device or a temperature sensor for detecting the first detection value corresponding to a temperature of the first switching device, and
   the second detector includes a current sensor for detecting the second detection value corresponding to current flowing in the second switching device or a temperature sensor for detecting the second detection value corresponding to a temperature of the second switching device.

5. The switching apparatus according to claim 3, wherein
the output wiring section includes a first wiring which has a first end and a second end and to which the second main terminal of the first switching device is connected at a point closer to the first end than the second main terminal of the second switching device,
the output terminal is connected to the first end side of the first wiring, and
the first main terminal of the opposing switching device is connected to the second end side of the first wiring.

6. The switching apparatus according to claim 2, wherein
the first detector includes a current sensor for detecting the first detection value corresponding to current flowing in the first switching device or a temperature sensor for detecting the first detection value corresponding to a temperature of the first switching device, and
the second detector includes a current sensor for detecting the second detection value corresponding to current flowing in the second switching device or a temperature sensor for detecting the second detection value corresponding to a temperature of the second switching device.

7. The switching apparatus according to claim 2, wherein
the output wiring section includes a first wiring which has a first end and a second end and to which the second main terminal of the first switching device is connected at a point closer to the first end than the second main terminal of the second switching device,
the output terminal is connected to the first end side of the first wiring, and
the first main terminal of the opposing switching device is connected to the second end side of the first wiring.

8. The switching apparatus according to claim 1, wherein
the first detector includes a current sensor for detecting the first detection value corresponding to current flowing in the first switching device or a temperature sensor for detecting the first detection value corresponding to a temperature of the first switching device, and
the second detector includes a current sensor for detecting the second detection value corresponding to current flowing in the second switching device or a temperature sensor for detecting the second detection value corresponding to a temperature of the second switching device.

9. The switching apparatus according to claim 8, wherein
the output wiring section includes a first wiring which has a first end and a second end and to which the second main terminal of the first switching device is connected at a point closer to the first end than the second main terminal of the second switching device,
the output terminal is connected to the first end side of the first wiring, and
the first main terminal of the opposing switching device is connected to the second end side of the first wiring.

10. The switching apparatus according to claim 1, wherein
the output wiring section includes a first wiring which has a first end and a second end and to which the second main terminal of the first switching device is connected at a point closer to the first end than the second main terminal of the second switching device,
the output terminal is connected to the first end side of the first wiring, and
the first main terminal of the opposing switching device is connected to the second end side of the first wiring.

11. The switching apparatus according to claim 10, wherein the opposing switching device includes a first opposing switching device and a second opposing switching device, and the output wiring section further comprises:
a second wiring which includes a first end and a second end and to which a first main terminal of the first opposing switching device is connected at a point closer to the first end than a first main terminal of the second opposing switching device; and
a third wiring for connecting the second end side of the first wiring and the second end side of the second wiring.

12. The switching apparatus according to claim 11, wherein the first wiring and the second wiring extend in parallel in a manner that the first end of the first wiring and the first end of the second wiring as well as the second end of the first wiring and the second end of the second wiring respectively oppose each other.

13. A determination apparatus, which is connected to a switching apparatus, wherein
the switching apparatus comprises:
a first switching device and a second switching device, each including a first main terminal and a second main terminal, wherein the first main terminal is connected to a first reference potential;
an opposing switching device including a first main terminal and a second main terminal, wherein the second main terminal is connected to a second reference potential;
an output wiring section for connecting the second main terminal of the first switching device, the second main terminal of the second switching device, the first main terminal of the opposing switching device and an output terminal, wherein a wire resistance between the second main terminal of the first switching device and the output terminal is lower than a wire resistance between the second main terminal of the second switching device and the output terminal, and a wire resistance between the second main terminal of the first switching device and the first main terminal of the opposing switching device is higher than a wire resistance between the second main terminal of the second switching device and the first main terminal of the opposing switching device;
a first detector for detecting a first detection value changing in accordance with current flowing in the first switching device; and
a second detector for detecting a second detection value changing in accordance with current flowing in the second switching device, and
the determination apparatus comprises a determining unit for determining whether an overcurrent flows in the output terminal or in the opposing switching device by using the first detection value and the second detection value.

* * * * *